United States Patent [19]

Bantz et al.

[11] Patent Number: 4,644,503
[45] Date of Patent: Feb. 17, 1987

[54] COMPUTER MEMORY SYSTEM WITH INTEGRATED PARALLEL SHIFT CIRCUITS

[75] Inventors: David F. Bantz, Chappaqua; Satish Gupta, Croton-on-Hudson, both of N.Y.; Bruce D. Lucas, Pittsburgh, Pa.

[73] Assignee: International Business Machines Corporation, Armonk, N.Y.

[21] Appl. No.: 567,215

[22] Filed: Dec. 30, 1983

[51] Int. Cl.[4] .............................................. G11C 13/00
[52] U.S. Cl. .................................. 365/230; 365/238; 364/521
[58] Field of Search ............... 365/230, 231, 239, 240, 365/238, 189; 340/726, 727, 801; 364/521; 382/41, 45, 44, 46

[56] References Cited

U.S. PATENT DOCUMENTS

| | | | |
|---|---|---|---|
| 3,893,088 | 7/1975 | Bell | 365/238 |
| 3,976,982 | 8/1976 | Eiselen | 340/172.5 |
| 4,150,364 | 4/1979 | Baltzer | 340/703 |
| 4,168,488 | 9/1979 | Evans | 340/146.3 H |
| 4,225,929 | 9/1980 | Ikeda | 364/521 |
| 4,249,172 | 2/1981 | Watkins et al. | 340/726 |
| 4,550,437 | 10/1985 | Kobayashi et al. | 382/41 |

OTHER PUBLICATIONS

Robert F. Sproull et al, "The 8×8 Display", Dec. 1981, p. 10—Section 2.5. The Shifter—Carnegie-Mellon University.

Andreas Bechtolsheim & Forest Baskett, "High Performance Raster Graphics for Microcomputer Systems", Computer Systems Laboratory, Stamford University—pp. 43–47 of Computer Graphics, vol. 14, No. 3, Jul. 1980.

Primary Examiner—Terrell W. Fears
Attorney, Agent, or Firm—Roy R. Schlemmer

[57] ABSTRACT

The system includes a plurality of memory units each for storing a plurality of independently addressable binary bits. The units operate together in response to each common bit address to supply a bit from each unit to form an array of bits for a discrete section of a larger array. The units are interconnected through common interconnection buses and selectively actuable input and output gate connections to those buses to provide for selective shifting of bits between units to change the bit array.

15 Claims, 8 Drawing Figures

FIG. 6A

COMPUTER MEMORY SYSTEM WITH INTEGRATED PARALLEL SHIFT CIRCUITS

DESCRIPTION

1. Technical Field

This invention relates to a memory system which may include a number of memory units arranged in an array, the memory system being particularly well adapted for use as a frame buffer memory for a cathode ray tube display, but having other uses as well.

2. Prior Art

A report was issued in December 1981 by the Department of Computer Science of the Carnegie-Mellon University of Pittsburgh, Pa. entitled "The 8 by 8 Display" and written by Robert F. Sproull, Ivan E. Sutherland, Alistair Thompson, Satish Gupta, and Charles Minter.

That report deals with memory arrays which are particularly useful for so-called frame buffers for storing graphical data for display on a medium such as a cathode ray tube. The present invention also deals with systems of that kind. In the systems of that report, as well as the systems of the present invention, a number of random access memory units, such as 64, are arranged together to form an array in which each unit supplies one bit to provide an array of bits for each one of a plurality of discrete array sections of a larger array. Each of the units may itself include a separate random access memory having the ability to store thousands of independently addressable binary bits. All of the units are addressable concurrently in response to the same array section address, which concurrently selects in each unit that bit which that unit contributes to the array section, thus allowing for concurrent read or write operations for all bits within one array section of the larger array.

A problem arises if a group of information bits to be updated (a word) overlaps from one array section to another. Thus, the data bits which are to be updated do not necessarily begin at the boundary of an array section, or end at another boundary of the array section. That problem is handled by incrementing the memory address by one for the data bits which fall into a new array section, so that those bits will be properly stored in the address for the next array section. If the data word is to be moved in position within the larger array, then the data bits must be shifted during the course of that move. The report teaches that such shifting may be accomplished by means of shift registers. However, as indicated in the report, the use of shift registers for such shifting is very time consuming, and reduces the overall efficiency of the memory system very seriously. Furthermore, the report does not teach mirroring, (rearranging the display to provide the mirror image of the former image), or rotation (rotating the image by perhaps 90 degrees) may be accomplished.

SUMMARY OF THE INVENTION

Accordingly, it is an object of the invention to provide an improved means for shifting data words in a memory system of the above description.

Another object of the invention is to provide an improved memory system including means for shifting data words into a reverse pattern for mirroring operations.

Another object of the invention is to provide an improved memory system which is particularly useful as a frame buffer memory which includes improved means for accomplishing a rotation of the data of a data word to provide for rotation of an image.

Other objects and advantages of the invention will be apparent from the following description and the accompanying drawings.

In carrying out the invention, there is provided a memory system comprising a plurality of memory units, each of said memory units being operable for storing a plurality of independently addressable binary bits, said units being operable in response to common bit addresses, said units being operable together in response to each common bit address to supply a bit from each unit to form an array of bits for a discrete section of a larger array, said units being interconnected through common interconnection buses, and selectively actuable input and output gate connections to those buses, to provide for selective shifting of bits between units to change the bit array.

In another aspect of the invention, there is provided a memory system for machine storage of digital information comprising a plurality of memory units, each of said units including a random access memory having a data input port and a data output port and having the capacity for storage of a plurality of independently addressable binary bits of information, said units being connected together to form an array in which each unit supplies one bit to provide a data word array of bits for each of a plurality of discrete sections of a larger array which is useful for graphical display, all of said units being addressable concurrently in response to the same array section bit address for each unit to provide for concurrent read or write operations for all bits within one section array of bits, a plurality of common interconnection buses extending between said units and arranged to receive new data input words in parallel, each of said units including a plurality of input data gates for controlling the transfer of binary bits selectively to said input ports from said interconnection buses, common control connections for corresponding data gates for all of said units, said interconnection buses being connected to the corresponding gates of each unit in a shifted manner to provide for a shift of incoming binary data words supplied to the units as determined by which unit gates are enabled.

DESCRIPTION OF THE PREFERRED EMBODIMENTS

Figure 1:
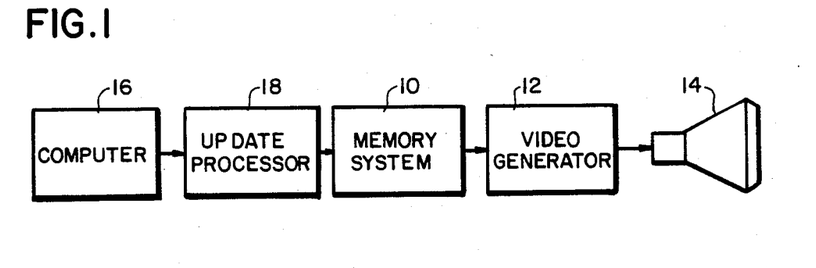
FIG. 1 is a schematic representation of a computer with a video display system of the kind in which the present invention is particularly useful as a video memory system.

FIG. 1 illustrates schematically a computer system including a cathode ray tube display of the kind in which the memory system of the present invention is particularly useful. The memory system of the present invention is indicated schematically at 10, and when used in a system such as illustrated in FIG. 1, may be referred to as a "frame buffer". The memory system 10 stores the information for video display. That information is supplied to a video signal generator 12, and thus to the cathode ray tube 14 on which the display appears.

The computer which is served by the display system is shown at 16, and may include a separate display update processor 18. Alternatively, the update processor 18 may be regarded as part of the memory system 10. The update processor 18 provides information to the memory system 10 relating to changes which are required in the graphical display. While the memory system of the present invention is particularly useful for cathode ray tube display systems, it is also very useful for other displays, such as liquid crystal displays, and displays to be generated by printers, as well as for non-graphical display uses.

Figure 2:
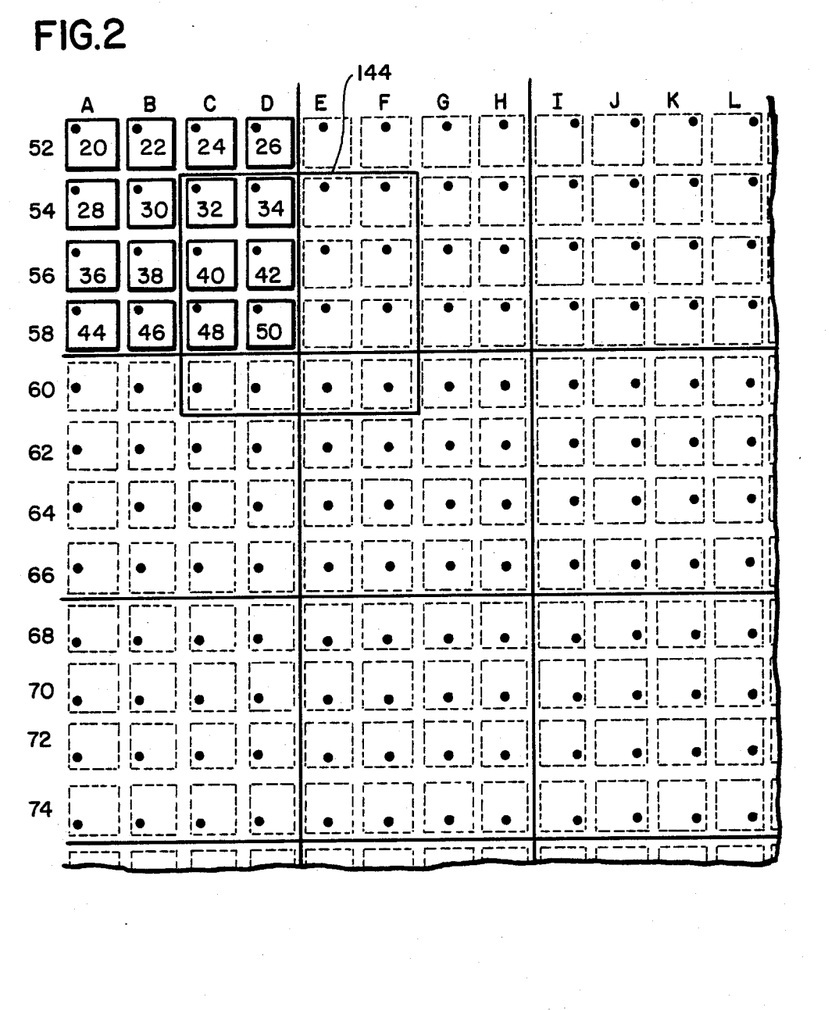
FIG. 2 is a schematic pattern representation of the memory system of the present invention which may be used in the combination of FIG. 1.

FIG. 2 is a schematic pattern representation of one embodiment of the memory system 10 of FIG. 1. The memory system is represented as a 4 by 4 array of 16 memory untis 20-50 arranged in rows numbered 52, 54, 56, and 58, and in columns lettered A, B, C, and D. Each of these memory units includes a random access memory having a data input port and a data output port and having the capacity for storage of a plurality of independently addressable binary bits of information. When the memory units are all addressed with the same bit address, as signified by the dot in the upper left hand corner of each of the memory units, those memory units are operable in response to that address to supply individual bits of a data word array of bits for the array section represented by columns lettered A-D and rows numbered 52-58. FIG. 2 illustrates a portion of a large array comprised of nine array sections with lettered columns and numbered rows.

When the memory units are provided with a different address, such as illustrated by the dots in the top center of the dotted unit representations in columns E, F, G and H and rows 52, 54, 56, and 58, a different data word array of bits is provided by the memory units 20-50 representative of the different section. If other addresses are used, other data word arrays of bits are brought forth, such as illustrated for instance by the array section at columns A-D and rows 60-66 with the address indicated by the dots positioned at left center in each of those dotted boxes. Similarly, another array section is illustrated at columns E-H and rows 60-66 with the array section address for the corresponding data word represented by a dot in the center of each memory unit box. In this manner, it can be seen that only 16 memory units may be employed to produce data word section arrays of bits for a much larger array. For instance, the random access memory included in each memory unit may have 16,000 or more different independently addressable data bits, and accordingly there may be 16,000 or more different data word section arrays of bits possible in constructing the larger array. Only nine such data word section arrays are illustrated in FIG. 2.

Figure 3:
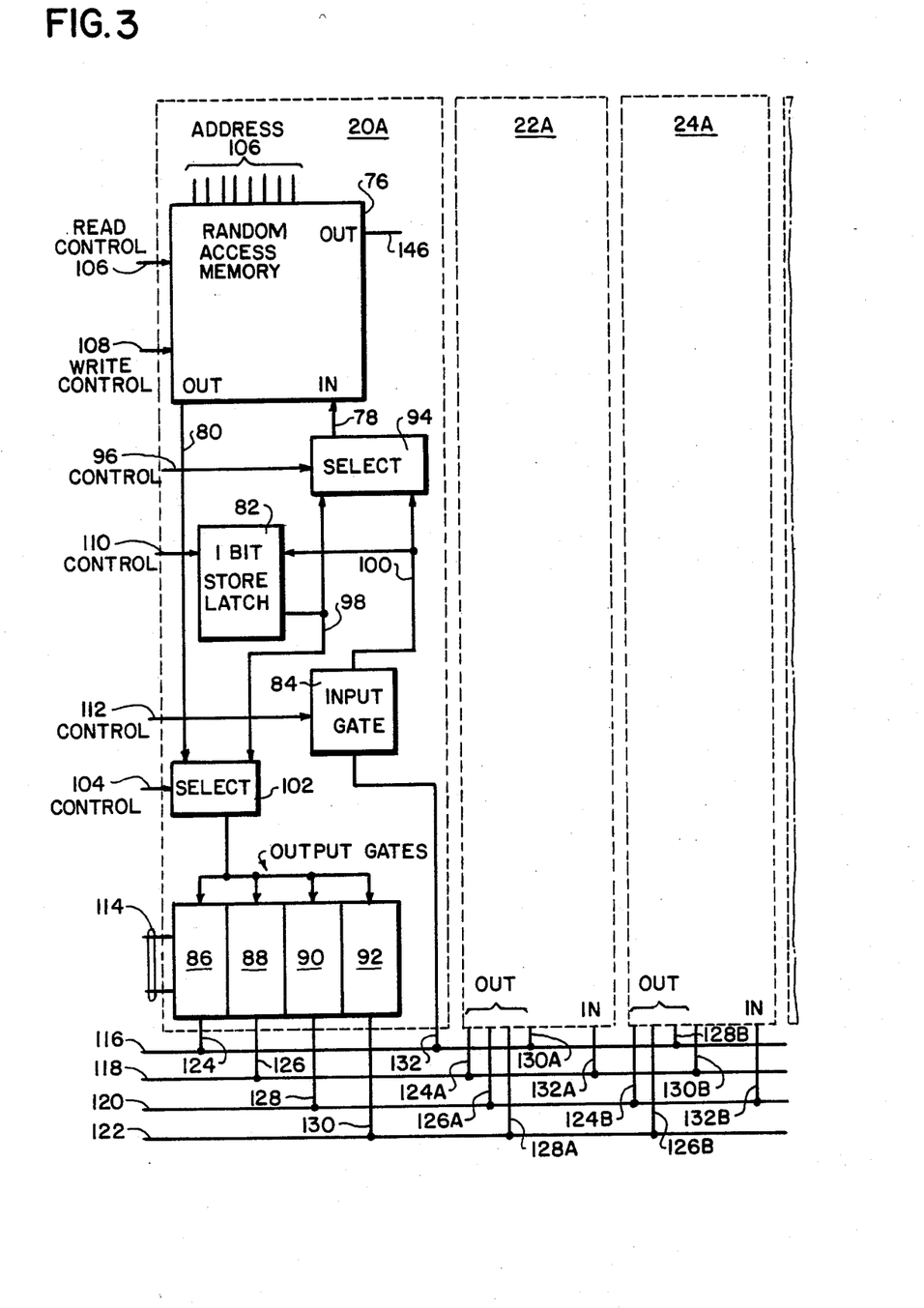
FIG. 3 is a schematic diagram illustrating details of a simplified version of one memory unit of the memory system of FIG. 2, and illustrating how individual memory units are interconnected with one another.

FIG. 3 illustrates schematically a memory unit 20A which is very similar (for example) to the memory unit 20 of FIG. 2. It includes a random access memory 76, having an input port at 78, and an output port at 80. The memory unit also includes, preferably, a one-bit storage latch 82, an input gate 84, and a plurality of output gates 86, 88, 90, and 92. The input signal supplied to the input port 78 of the random access memory 76 is controlled by a select switch means 94 which is controlled by a control input signal at 96. Depending upon whether that control signal at connection 96 is a logic "0" or a logic "1", the select switch 94 determines whether the input signal at input port 78 is to be taken from the one bit store latch 82 on connection 98, or a signal from the input gate 84 on connection 100. A similar select switch 102 is operable in response to a select control signal on an input control connection 104 to determine whether an output signal from the unit 20A is to be from the output port 80 of the random access memory 76, or from the one bit store latch 82 on connection 98.

The random access memory 76 is supplied with address information at the address input connections 106. The eight address input lines are time multiplexed with a first set of signals which selects a column of memory 76, and a second set of signals which selects a row within the memory 76. Thus, over 64,000 addresses can be used to separately address each of the 64,000 bits stored in the memory 76.

To determine whether the memory 76 is to be operated in the read mode or the write mode, read control or write control signals are supplied to the memory 76 on the respective control input connections 106 and 108. Another control connection is provided at 110 for controlling the operation of the one bit store latch 82, making that latch receptive to input information on connection 100 from the input gate 84 and making the latch operable to provide an output on connection 98 to the select switch 102.

The operation of the input gate 84 is controlled by a signal on an input control signal line 112, and the output gates 86, 88, 90, and 92 are operable in response to a combination of control signals on connections 114 to determine which, if any, of the four gates will be operable to supply the output bit to its associated bus. Four interconnection buses 116, 118, 120, and 122 are illustrated in the drawing which are respectively associated with the output gates 86, 88, 90, and 92. It will be understood that FIG. 3 is greatly simplified in that only four interconnection buses are illustrated. In an actual system, according to this invention, additional interconnection buses are typically provided, as further explained below in connection with other drawings.

Additional memory units 22A and 24A are illustrated in FIG. 3, and are intended to be substantially identical to the memory unit 20A, and therefore the details of memory units 22A and 24A are not illustrated. The memory units 22A and 24A, and all of their other counterparts (not shown) are connected to receive the same control signals on connections corresponding to the read control 106, the write control 108, the gate control 96, the latch control 110, the input gate control 112, the select control 104, and the output gate controls 114.

Thus, all of the memory units 20A, 22A, 24A, and their counterparts, receive the same control signals at the same time. The addresses supplied to the different memory units 20A, 22A, 24A, etc. are also usually the same, with the exceptions explained below.

In operation, the interconnection buses 116, 118, 120, 122 may preferably be connected to receive update information in the form of a parallel set of bits (a data word) on those respective buses. The first bit on bus 116 is supplied through the input connection 132 to the input gate 84. The second bit on bus 118 is supplied through connection 132A to a corresponding input gate within memory unit 22A. The third bit is supplied on bus 120 through connection 132B to a corresponding input gate in memory unit 24A. At the same time, the control signal on 112 enables the input gate 84 and the counterparts in the other memory units, and the control signal on connection 96 enables the select switch 94 to provide the new data bit through the input port 78 to the random access memory 76. The position in memory is determined by an address supplied through address lines 106. Alternatively, select switch 94 may be disabled by the signal at control input 96 to prevent transmission of the input bit to memory, and the bit store latch 82 may be enabled by its control signal to receive and store the new data. In this manner, it is to be seen that the data word appearing on the parallel buses 116, 118, 120, and 122 is stored in the respective memory units 20, 22, and 24, etc.

When a data bit is stored in latch 82, at a later time, by enabling the latch 82 and the select switch 94, the data bit may be transferred from the latch 82 to the memory 76. This operation occurs simultaneously for an entire data word array segment.

If data is to be moved out of the individual memory units onto the interconnection buses, the select switch 102 is provided with a control signal on 104 to determine whether the output is to come from the latch 82 or from the memory output port 80, and the output gates 86, 88, 90, and 92 are controlled by signals on 114 to determine which gate is to be active, and which bus the data bit is to be applied to. If there is to be no shift of the data, gate 86 is actuated, putting the data on connection 124 to bus 116, which is the same bus to which the corresponding input date connection 132 is connected. In the case of memory units 22A and 24A, the output and input connections from the corresponding gates are numbered the same, but with letter A suffixes for unit 24A. The output connection 124A is connected to the same interconnection bus 118 as the input connection 132A for unit 22A, and the output connection 124B of unit 24 is connected to the same bus 120 as is the input connection 132B of unit 24A. Thus, if the 86 gates are enabled, there is no shift of data. However, when a shift of one memory unit position in the array is desired, gate 88 is enabled. This moves the output bit of unit 20 to the output connection 126 and to the bus 118. This is the interconnection bus to which the input connection 132A of unit 22A is connected. Thus, a one step shift of data is accomplished from unit 20A to unit 22A. At the same time, the output bit on connection 126A from unit 22A appears on bus 120, which shifts that bit of information to the input connection 132B of the unit 24A. In similar manner, the output on 126B from unit 124 is shifted to still another unit (not shown).

If a two position shift is desired, then gate 90 is enabled, moving the output through connection 128 to bus 120 from unit 20A, moving the output through connection 128A to bus 122 from unit 22A, and moving the output through connection 128B to bus 116 from unit 24A. Thus, there is an "end around carry" of data bits in this shifting operation, because the bit read from the unit 24A onto bus 116 is read by the read gate 84 of unit 20A.

At least one input gate in each unit is enabled at the same time that an output gate is enabled. The data bit is stored in the latch 82 if it came from memory 76, and stored in memory 76 if it came from the latch 82.

The shifting of data between memory units is useful for the purpose of updating the information stored in the memory system. While there are other uses for which the memory system of the present invention may be applied, the utility of the system is explained in terms of graphical displays. Stated in those terms, the shifting of the data between memory units is useful for the purpose of causing the display to scroll (to move across the display screen or other medium), or to rotate, or to reverse (produce a mirror image). These operations will be described more fully below.

The invention has been explained in a simplified form in FIG. 3 to promote an understanding of the principles of the invention. While a single input gate is disclosed in FIG. 3, with multiple output gates, it will be apparent that a single output gate could be provided, with multiple input gates. With such an arrangement, the same shifting operations can be accomplished as with multiple output gates. Furthermore, a combination of multiple output gates and multiple input gates may be employed in order to provide additional shifting possibilities.

Figure 4:
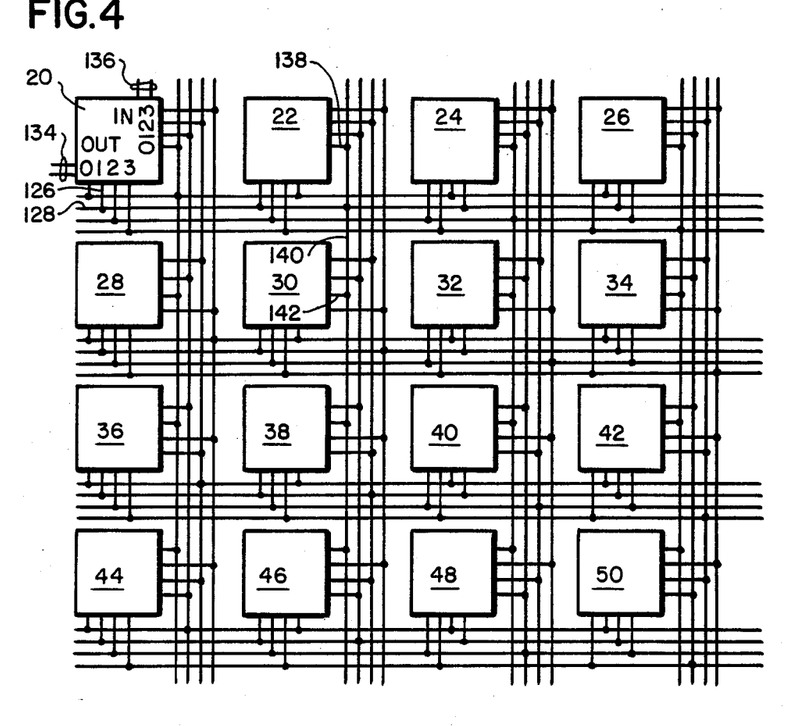
FIG. 4 is a schematic diagram showing how individual memory units, such as those illustrated in FIGS. 2 and 3 may be interconnected with interconnection buses for two dimensional shifting.

For instance, FIG. 4 indicates, in a very schematic way, the full four by four array of units of FIG. 2, showing the interconnection buses necessary to provide both horizontal and vertical shifting of data by selection of a combination of output gates and input gates connected to a combination of horizontal and vertical interconnection buses. All of the sixteen memory units 20-50 are illustrated in FIG. 4. However, detailed identifications of the output gate connections and input gate connections are illustrated only for unit 20. In each unit, the output gate connections are shown at the bottom of the unit, and the input gate connections are shown at the right side of the unit. Four gate control connections are required, as indicated at 134 and 136 to provide two binary bit signals on connections 134 to control the output gates, and two binary bit signals at 136 to control the input gates.

While other arrangements could be employed to accomplish the purposes of this particular array, the shifting accomplished by controlling the output gates is used to shift the data bits to the right (in the horizontal), and the shifting accomplished by controlling the input gates is used to shift data downwardly (in the vertical). Thus, for instance, if output gate "1" is used, providing a signal at unit 20 on output connection 126 to bus 128, and if input gate "0" is enabled, there is simply a one position shift to the right in the array. The bit read from the output gate "1" of unit 20 appears on the input gate "0" of unit 22 at connection 138. However, if the input gate "1" is enabled, the shift is not only one to the right but one downwardly. Thus, the output bit at 126 which appeared on bus 128 is transferred to a vertical bus 140 and is picked up by the number "1" input gate at unit 30 at connection 142. Following these logical principles, it will be apparent from FIG. 4, that any desired two dimensional shift within the array can be accomplished by a combination of controls for the horizontal shift by the output gates and the vertical shift by the input gates.

Referring back again to FIG. 2, if the data bits are shifted down one and over two, data originally stored in columns A-D and rows 52-58 are shifted to a new frame position indicated by box 144. Thus, the data bits originally stored in units 20 and 22 at positios A and B 52 are moved respectively to units 32 and 34 at positions C and D 54. Similarly, the data bits originally stored in units 24 and 26 are now moved to the array positions E and F 54. However, these data bits have been end around carried to memory units 28 and 30 with an incremented address corresponding to the spots which are centered in the boxes E and F 54. Thus, whenever there is an end around carry of data bits through the interconnection buses, there is an incrementation of the addresses to recognize that the carry has taken place, and to provide addresses corresponding to the new shifted positions of the data.

Similarly, the data bits originally stored at memory units 48 and 50 at positions C and D 58 have been moved to the large array positions E and F 60. These data bits have been end around carried horizontally and vertically, and are now stored in memory units 20 and 22 with an address which has been incremented for the horizontal shift and also for the vertical downward shift. In this manner, it will be seen that the interconnection buses provide the function of the shifting of data for update purposes in both horizontal and vertical directions.

In shifting operations of the kind discussed immediately above, in which data is shifted from one memory unit to another, in order to accomplish a scrolling function, or other functions to be described more fully below, it is necessary to employ the latch 82 (in FIG. 3) in each unit for storage of the data bits to be shifted either before or after shifting. This is necessary, because each memory unit is involved in providing a data bit to be read, and in receiving a data bit which is to be written in a shifted position. Thus, referring back again to FIG. 2, the data bit in unit 20 which is shifted to unit 32 may be stored in the latch 82 of unit 20, and then written into the random access memory 76 of unit 32. Alternatively, that bit may be stored in the memory 76 of unit 20, may be read from the addressed position in that memory, and then stored in the latch 82 of unit 32.

Where the interconnection buses, such as buses 116-122 in FIG. 3, are to be used to accomplish a data shift as the data is written into the memory units from the source of update data, such as from the update processor 18 of FIG. 1, the one bit store latch 82 of FIG. 3 may be omitted, and multiple input gates are provided for each memory unit. The amount of shifting to be accomplished during the refresh data input step is then determined by which input gate is selected for each unit, and the data is stored directly into the random access memory 76. For this purpose, of course, the interconnection buses are connected to receive signals from the update processor 18 (FIG. 1).

All of the control signals for the memory units discussed above in connection with FIG. 3, including the control signals received on connections 106, 108, 96, 110, 112, 104, and 114 are preferably supplied from the update processor 18. The update processor 18 may be integrated with the memory system 10, if desired. The circuit arrangements for the update processor 18 may be carried out in accordance with the teachings of a prior co-pending patent application Ser. No. 394,044 filed by Dill et al for "CIRCUITS FOR ACCESSING A VARIABLE WIDTH DATA BUS WITH A VARIABLE WIDTH DATA FIELD" filed on June 30, 1982 and assigned to the same assignee as the present application. That application is incorporated herein by reference. That application discloses a system which accomplishes the control functions of determining when there is to be an end around (overflow) shift (a misalignment of a word array of bits with a discrete section of the larger array), how many bits to be end around shifted, and incrementing the addresses of bits to be end around shifted.

The disclosure of the present invention, up to this point, is primarily concerned with the function of updating the data stored within a memory system which is useful for visual displays, such as cathode ray tube displays. It is understood, of course, that the memory system must be read from time to time in order to refresh the display (if the display is on a cathode ray tube), and in order to carry the updated information to the display. In order to accomplish this function, each of the random access memories 76 of the memory units 20 et seq preferably includes, at least functionally, a second output port indicated at 146 in FIG. 3. This second output port function is preferably provided in accordance with the teachings of a co-pending U.S. patent application Serial No. 393,996, filed on June 30, 1982 by F. H. Dill for a "RANDOM ACCESS MEMORY HAVING A SECOND INPUT/OUTPUT PORT" issued Sept. 10, 1985 as U.S. Pat. No. 4,541,075 and assigned to the same assignee as the present application. That application is incorporated herein by reference. The function of reading the stored data out to the display is preferably carried out in accordance with the teachings of that application. Accordingly, the present specification does not disclose the details of the structure for that function.

A substantial shift in position of the data within the larger array may be accomplished by assigning addresses for writing the data word in the respective units which have a substantial fixed difference from the unit addresses from which the bits of the word were originally read to provide for substantial movement of the data word within the larger array. This is another way in which operations such as scrolling can be accomplished. The assignment of incremented addresses is accomplished by the update processor 18 of FIG. 1.

In order to accomplish such a shift, the section array data word must be first moved from the original memory addresses into the latches 82 (FIG. 3), and then in a latter operation the data word bits must be transferred through the interconnection buses to the new addresses. It will be understood that bit by bit shifting may be concurrently accomplished, as previously discussed above. Accordingly, such a transfer of bits may be carried out between any two positions in the larger array.

The entire memory unit, such as memory unit 20A of FIG. 3, is preferably formed on a single large scale integrated circuit chip. Furthermore, if sufficient circuit capacity can be provided for the desired objectives of data storage, it is preferred to incorporate all of the memory units together with all of the interconnection buses of the array into a single circuit chip.

Up to this point, the invention has been explained and illustrated largely in terms of 4×4 sector arrays, as illustrated in FIGS. 2 and 4. However, it will be understood that sector arrays having different configurations may be employed. For instance, FIG. 5 illustrates an 8×1 array which is eight units wide and one unit high.

Such an array may be used for instance where eight, rather than sixteen units are to be employed, and perhaps where each unit includes a random access memory 76 of 128,000 bits.

Figure 5:
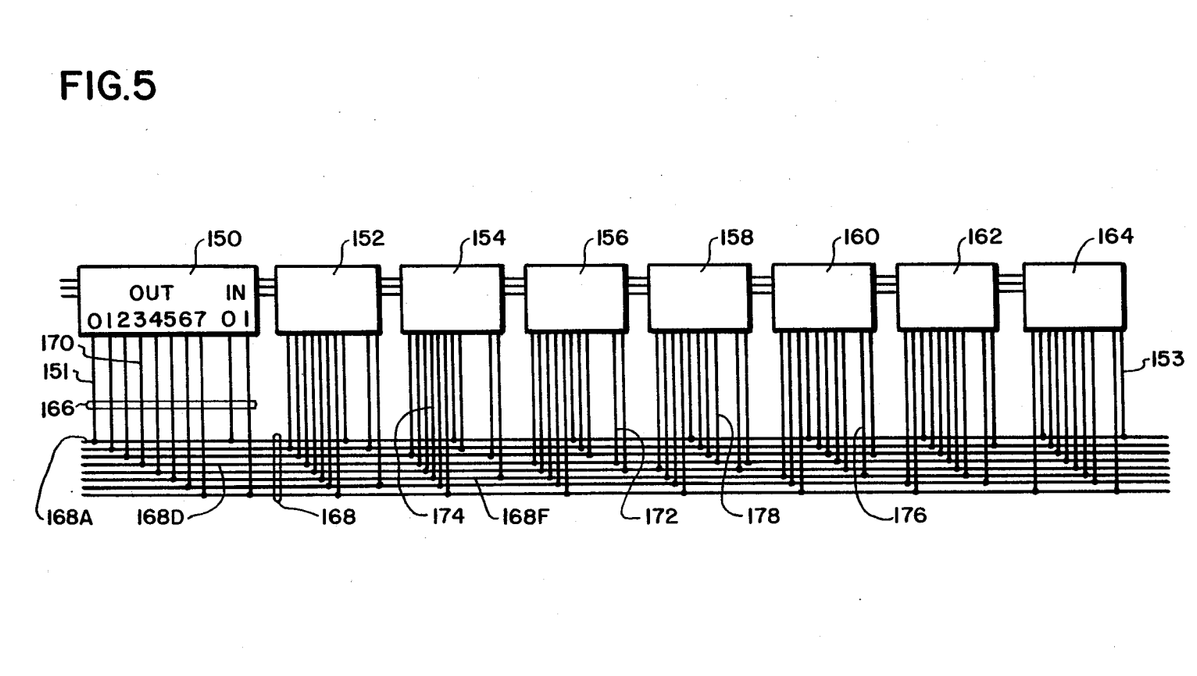
FIG. 5 illustrates an 8×1 configuration of memory units which illustrates both translational bit shifting and mirror shifting of bits.

In FIG. 5, the eight memory units are designated 150 through 164. Each unit includes eight output gate connections (shown at 166 for unit 150) respectively for each of the eight interconnection buses 168. These output gate connections are arranged analogously to the corresponding output gate connections of FIG. 3, except that there are eight instead of 4. Each unit also includes two input gate connections, designated "0" and "1" in unit 150. The input gate connection designated "1" is for a mirroring function which is described immediately below. The input gate connection designated "0", the one shown on the left at each of the units 150 through 164, is analogous to the input gate 84 of FIG. 3.

The operation of FIG. 5 will be first described assuming that only the input gate connections designated "0" are enabled, and ignoring the input gate connections designated "1".

As in FIG. 3, the amount of shift provided to the binary bits read from each of the memory units 150-164 in FIG. 5 is determined entirely by which of the output gates is enabled. If the "0" gate is enabled, the shift is 0. If the "1" gate is enabled, the shift is 1, etc. right up to 7. As an illustration, if all of the "3" output gates are enabled, the binary digit read out from unit 150 appears on the "3" output at 170. That places the output signal on interconnection bus 168D. The only input gate of a unit which is connected to that interconnection bus 168D, is the input gate connection indicated at 172 for the unit 156. Thus, it is apparent that a three position shift has been accomplished. Meanwhile, the "3" output from unit 154, for instance, appears on connection 174, which carries the binary digit 2 interconnection bus 168F, and through that bus to the input gate connection 176 to unit 160. Further analysis of the staggered connections of the output gates and the input gates to the interconnection buses will show that the other shifting operations, are verifiable. Such shifting operations may result in end around carries. For instance, if the output gate 7 connections are enabled, the gate 7 output from unit 158 on connection 178 is applied to bus 168D, and stored in unit 156 thrrough input gate connection 172.

If the input gates "1" are enabled instead of the input gates "0" in FIG. 5, the result is a mirror image shift of the data bits between the units. Thus, if the "0" output gates are enabled, and the mirror input gates "1" are enabled, the digital bit stored in unit 150 is shifted to the other end unit 164 while the binary bit in 164 is shifted to the unit 150. In similar manner, the data bits are interchanged between units 152 and 162 and also between 154 and 160 and between 156 and 158. In one specific example, an output signal from gate "0" at unit 150 appears at connection 151, is thus applied to interconnection bus 168A, and is picked up by the input gate connection 153 at unit 164. Further specific examples are not believed to be necessary. However, it will be apparent that a combination of transfer shifting and mirroring are available by selecting different output gate connections in conjunction with the mirroring input gate connection "1" for each of the units.

It will be understood that if a mirroring operation of a large image is to be accomplished, there must be also a mirroring operation in the assignment of the addresses of the array sectors to which the mirror data is transferred so as to reverse the gross position of the display data bits, as well as reversing the order of those bits within a small word segment.

Figure 6:
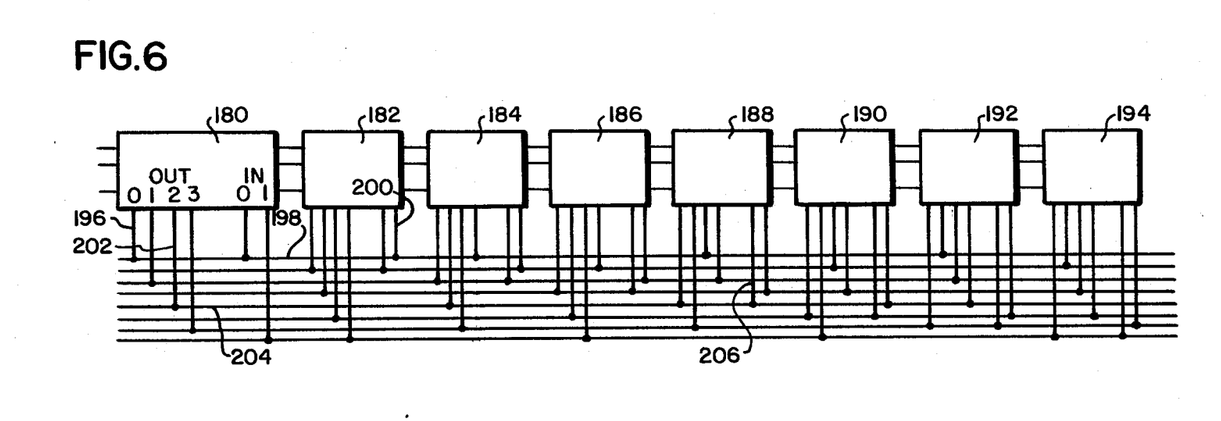
FIG. 6 illustrates an 8×1 sectional array of memory units with a combination of multiple output connections and multiple input connections to interconnection buses which provide for full bit shift capabilities with a reduced number of unit connections.
Figure 6A:
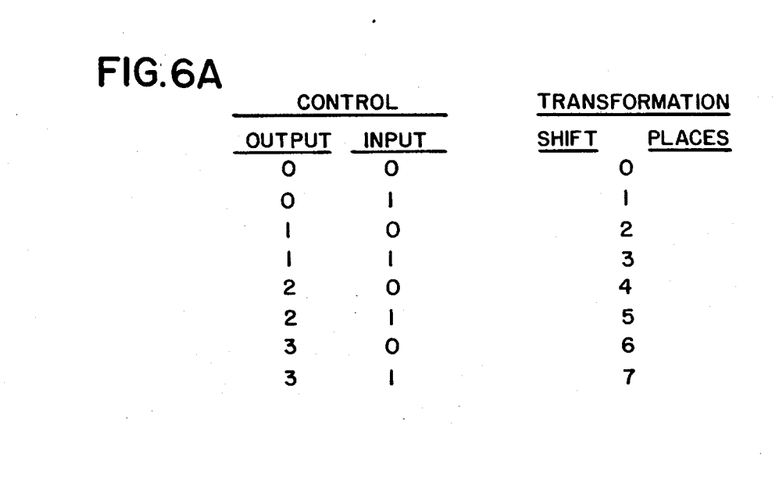
FIG. 6a is a table explaining the operation of FIG. 6.

Disregarding the mirroring function, and concentrating upon the transverse shifting function of FIG. 5, the efficiency of structure for accomplishing that shifting function can be greatly improved by adopting a modified arrangement as shown in FIG. 6. In FIG. 5, for a horizontal shift of zero through seven positions with the single input gate (ignoring the mirroring input gate) and the eight individual output gates from each unit to each of the eight buses requires three gate control input connections for a total of twelve connections to each unit. However, by means of the combination of gates illustrated in FIG. 6, with two translation shifting input gates instead of one, the number of output gates may be cut in half. This reduces the total of gate connections by three. This is accomplished by switching the input gates to accomplish a zero shift or a shift of one position to augment the shifting accomplished by means of the output gates. It is this "factoring" of the output and input gate shifting that permits the reduction in the number of output gates. FIG. 6A is a table showing how the combinations of output and input controls, as shown in the first two columns accomplish the shift transformation in terms of a shift of a desired number of places.

Referring back to FIG. 6, eight memory units 180 through 194 are illustrated, each having four output gate connections numbered "0", "1", "2", "3", and two input gate connections numbered "0", "1". Unit 180 has been shown slightly enlarged so as to permit space for the lettering indicating the different gates. That lettering has not been repeated in units 182 through 194, since it is identical to that of unit 180.

The operation of the gates and interconnection buses of FIG. 6 is explained very much by the table of FIG. 6A. However, several illustrative examples of the operation are given in detail as follows:

If output gate "0" is active, the output from unit 180 on connection 196 carries the output signal to the uppermost interconnection bus 198. If the input gate "1" is active, then that bit signal is picked up from bus 198 at the "1" input connection 200 of unit 182. Thus, a one bit shift has taken place. In another example, output gate "2" is active, as indicated at 202 at memory unit 180 to place a signal on the interconnection bus 204. If the "0" input gate connections are active, that signal is picked up by the input connection 206 of memory unit 188, thus providing for a four position shift. This is in accordance with the table of FIG. 6A. Further examples will verify that the operation of FIG. 6 proceeds in accordance with the table of FIG. 6A.

From all of the preceding explanations, and drawings, it is apparent that shifting movement of binary information between units may take many forms. For instance, a physical rotation of the binary bits between units may be accomplished, as illustrated in a very simplified form in FIG. 7.

Figure 7:
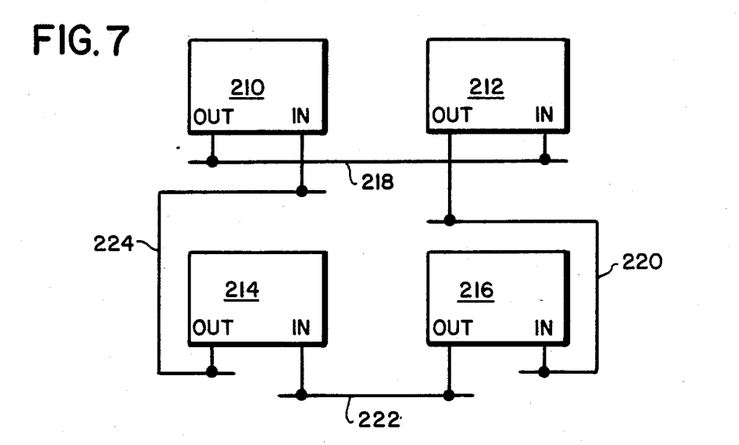
FIG. 7 illustrates another modification of the invention in which a rotation of the pattern of bits is accomplished for the purpose of rotating a display derived from the bit information.

FIG. 7 illustrates how the teachings of the present invention may be employed to accomplish a physical rotation of data bits by 90 degrees. In order to simplify the presentation, only four memory units 210, 212, 214, and 216 are illustrated. In an actual physical embodiment, there would generally be at least eight and possibly sixteen units. The output gate illustrated for unit 210 is connected through an interconnection bus 218 to an input gate connection of unit 212. Similarly, the output gate connection from unit 212 is connected through an interconnection bus 220 to the input gate connection of unit 216. In similar manner, the output of 216 is connected to the input of 214 by bus 222, and the output of 214 is connected through bus 224 to the input of unit 210. Thus, when the respective output and input gates are enabled, the data bits read from the four units are rotated by 90 degrees to the rotationally adjacent units.

It will be understood that additional interconnection buses and gates will typically be provided in any system including this rotational feature. Thus, the rotation would occur only when the gates associated with the interconnection buses for rotation are enabled. It will also be understood that the interconnection bus system will be substantially more complicated when the array is, for instance a 4×4 array. However, the present FIG. 7 is adequate to illustrate the basic concept of rotation of data bits within the array.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

Having thus described our invention, what we claim as new, and desire to secure by Letters Patent is:

1. A memory system for machine storage of digital information comprising a plurality of memory units, each operable for storage of a plurality of independently addressable binary bits of information, each of said memory units including a random access memory having a data input port and a data output port, and each of said memory units including a latch for storage of one binary bit of information for that unit for update purposes, said units being connected together to form a bit array in which each unit supplies one bit to provide a data word array of bits for each of a plurality of discrete sections of a larger array which is useful for graphical display, all of said units being addressable concurrently in response to the same bit address for each unit to provide for concurrent read or write operations for all bits within one section array of bits, a shifting means comprising a plurality of common interconnection buses extending between said units for shifting of data bits between said units and arranged to receive new data input word bits in parallel, each of said units including a plurality of data gates for controlling the transfer of binary bits selectively through said interconnection buses between said units to provide for selective shifting of bits between units to change and thus update the bit array.

2. A system as claimed in claim 1 wherein said gates are operable for controlling the transfer of binary bits selectively through said interconnection buses between one of said memory ports or said latch and said latch or one of said memory ports respectively for the same one of said units or for a different one of said units.

3. A system as claimed in claim 1 wherien said data gates include at least one input gate and at least one output gate and a plurality of gates of at least one of the input category and the output category of gates.

4. A system as claimed in claim 1 wherein there are provided common control connections for simultaneously activating corresponding data gates for all of said units.

5. A system as claimed in claim 4 wherein there is included an update processor for providing common control signals on said common control connections for said data gates and for supplying common bit addresses.

6. A system as claimed in claim 4 wherein said interconnection buses are connected to the corresponding gates of each unit in a shifted manner to provide for a shift of binary data of selected magnitude during transmission of data words through said buses as determined by which set of corresponding unit gates are enabled.

7. A memory system as claimed in claim 6 including means operable upon the transfer of a word array of bits into said units for detecting when a word array of bits is misaligned with a discrete section of the larger array, said last named means being operable to provide for an end around shift of overflow data bits for storage in earlier units of said array in a folded format while assigning an incremented address to the overflow data bits corresponding to a next adjacent discrete section of the larger array.

8. A system as claimed in claim 7 which is operable to read a data word of bits from said units and to transfer the data word through said interconnection buses to said unit latches and to then transfer the data word from said unit latches through said interconnection buses to write the bits of the data word in said respective units, said shifting means being operable to assign addresses for writing said data word in said respective units which have a fixed difference from the unit addresses from which the bits of the word were read to provide for substantial movement of the data word within the larger array.

9. A system as claimed in claim 7 wherein said interconnection buses are connected to different respective gates of said units to provide for successively different magnitudes of scrolling shift operations upon the selection of different corresponding gates.

10. A system as claimed in claim 9 wherein said gate connections to said interconnection buses are arranged to provide for a selection of shift steps in increments of one.

11. A system as claimed in claim 10 wherein said input and output gate connections are factored to provide for selected shift steps by combinations of output and input gates to thereby limit the required number of gates.

12. A system as claimed in claim 7 wherein the interconnections of said interconnection buses with said gates of said units are arranged and operable for providing a mirror image shift of said data word bits.

13. A system as claimed in claim 7 wherein said arrays in which said units are arranged are two dimensional, and wherein at least some of said interconnection buses are arranged to shift data between units in said two dimensional array to provide for a 90 degree rotation of the graphical data word.

14. A system as claimed in claim 1 wherein said units are arranged in a linear array and said gates are arranged with said buses to provide for a linear shift of data along said linear array.

15. A system as claimed in claim 1 wherein said memory units are arranged in a two dimensional array and wherein said interconnection buses are arranged in two dimensions with gate connections to said units operable to selectively provide for a two dimensional shift of data bits.

* * * * *